United States Patent
Abys et al.

(10) Patent No.: US 6,534,192 B1
(45) Date of Patent: Mar. 18, 2003

(54) MULTI-PURPOSE FINISH FOR PRINTED WIRING BOARDS AND METHOD OF MANUFACTURE OF SUCH BOARDS

(75) Inventors: Joseph A. Abys, Warren; Chonglun Fan, Bridgewater; Brian T. Smith, Somerville; Bruce F. Stacy, North Brunswick; Chen Xu, New Providence, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/405,368

(22) Filed: Sep. 24, 1999

(51) Int. Cl.[7] .................. H05K 1/09; H01L 29/12; B32B 15/20
(52) U.S. Cl. .................. 428/620; 428/652; 428/670; 428/671; 428/675; 174/256
(58) Field of Search .................. 428/622, 626, 428/627, 632, 670, 652, 674, 680, 672, 673, 648, 620, 671, 675; 174/256, 257, 258

(56) References Cited

U.S. PATENT DOCUMENTS

| | | | | |
|---|---|---|---|---|
| 4,529,667 A | * | 7/1985 | Shiga et al. |
| 4,572,925 A | * | 2/1986 | Scarlett |
| 4,872,851 A | * | 10/1989 | Babuka et al. |
| 5,552,031 A | * | 9/1996 | Moon |
| 5,608,966 A | * | 3/1997 | Donner et al. |
| 5,674,326 A | * | 10/1997 | Wrezel et al. |
| 5,801,436 A | * | 9/1998 | Serizawa |
| 5,976,344 A | * | 11/1999 | Abys et al. |
| 6,180,523 B1 | * | 1/2001 | Lee et al. |

* cited by examiner

*Primary Examiner*—Deborah Jones
*Assistant Examiner*—Jason Savage

(57) ABSTRACT

A printed wiring board (PWB) and a method of manufacturing the same. In one embodiment, the PWB includes: (1) a substrate having a conductive trace located thereon and (2) a multi-purpose finish including palladium alloy where palladium is alloyed with cobalt or a platinum group metal and is located on at least a portion of the conductive trace, which forms both a non-contact finish and a contact finish for the PWB.

11 Claims, 4 Drawing Sheets

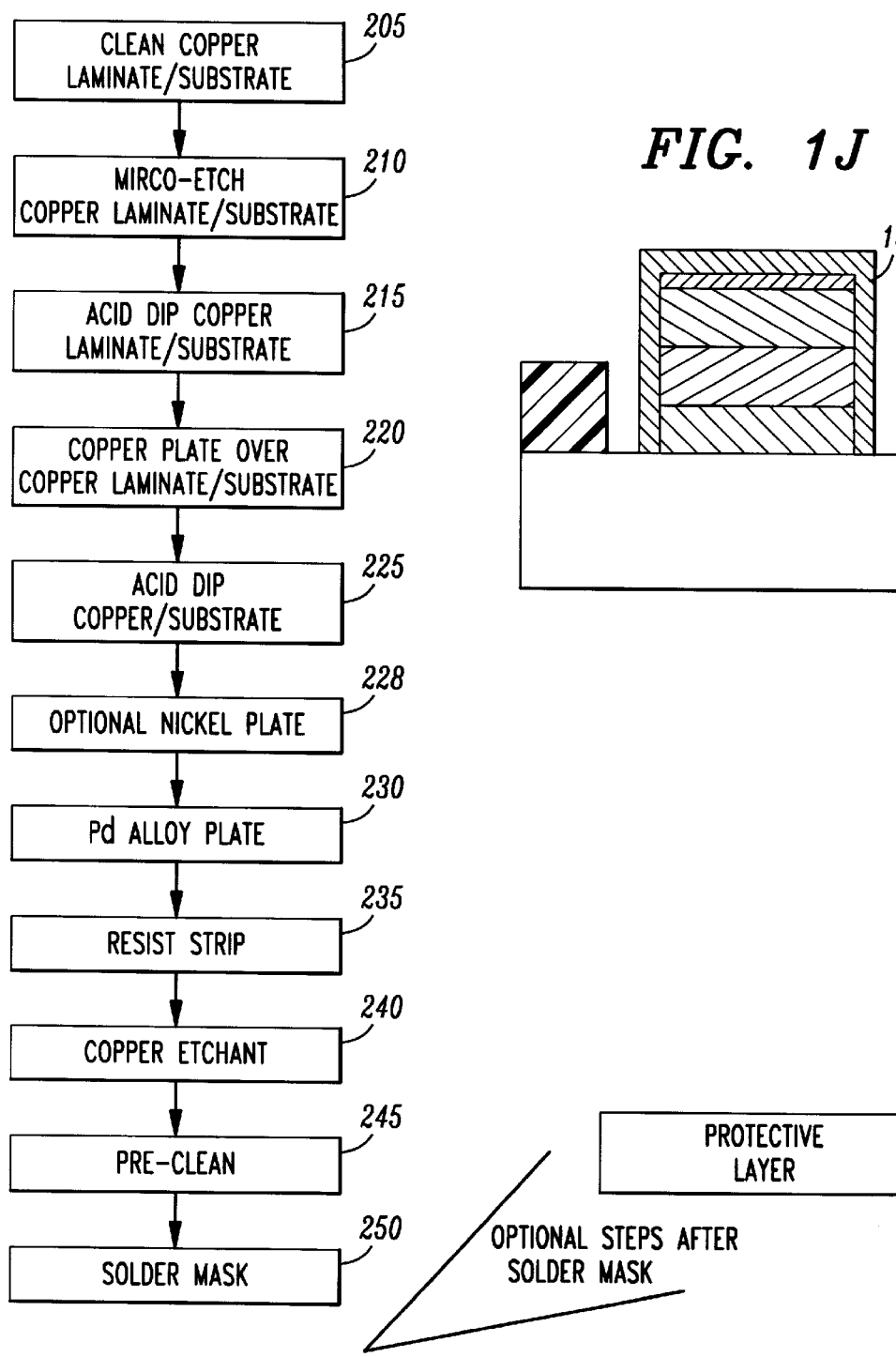
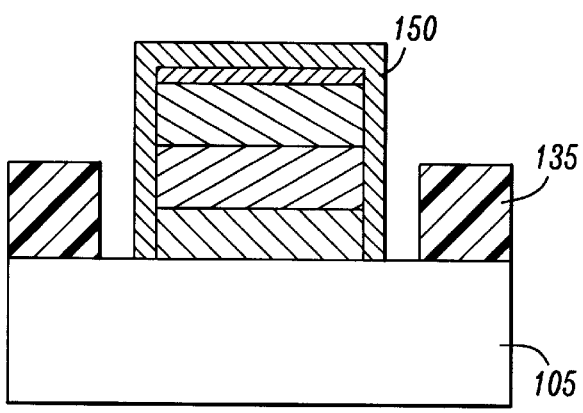

MULTI-PURPOSE FINISH FOR PRINTED WIRING BOARDS AND METHOD OF MANUFACTURE OF SUCH BOARDS

TECHNICAL FIELD OF THE INVENTION

The present invention is directed, in general, to circuit boards and, more specifically, to a multi-purpose finish for printed wiring boards (PWBs) and method of manufacture of such PWBs.

BACKGROUND OF THE INVENTION

Printed Wiring Board (PWB) manufacturing processes are changing at a rapid rate because of the increasing demand for enhanced performance. The demand for enhanced performance is due to higher circuit densities, an increase in board complexities and an increase in the cost of environmental compliance. Many types of final finishes are used on PWBs. Final finish selection is generally dependent on the requirements the board must ultimately meet. Surface circuits on PWBs usually include copper and copper alloy materials that should be coated to provide good mechanical and electrical connection with other devices in the assembly.

Typically, the coating on the circuits is called the surface finish. The circuits include non-contact areas and contact areas. The finish applied to the non-contact areas is called non-contact finish and the finish applied to the contact areas is called contact finish. The non-contact areas include wire-bonding areas, chip attach areas, soldering areas and other non-contact areas. Both non-contact and contact finishes must meet certain different requirements. Non-contact finish requirements include good solderability, good wirebonding performance (for some PWBS, depending on applications), and high corrosion resistance. Contact finish requirements on the other hand, include high conductivity, high wear resistance and high corrosion resistance. To meet these different requirements, different coatings have been used for non-contact finishes and contact finishes.

Some typical non-contact finishes include hot air solder level (HASL) coating, electroless nickel coating with immersion gold on top (EN/IAu), organic solderability preservative (OSP) coating, and organo-metallic, such as organo-silver, solderability preservative (OSP/Ag). A typical contact finish may include an electrolytic nickel coating with an electrolytic hard gold layer (gold-nickel or gold-cobalt alloys with nickel or cobalt less than 0.3 wt.%) on top. To coat any of the above non-contact finishes on the circuits and to coat the finish on the contact areas requires considerable processing steps (24–28 steps), and a great amount of time, all of which decreases production yields and increases cost.

The most common non-contact finish process in circuit boards is HASL. The use of HASL over the last few years has decreased dramatically. This is primarily due to the increasing demand for boards employable in mixed technologies, including surface mount technologies, of which HASL is not. In manufacturing a PWB using HASL, a photoresist layer is placed on a base copper laminate substrate, and subjected to ultraviolet light, which develops the pattern for the desired circuits. Next, the photoresist is washed, leaving openings in the areas that were masked off from the UV light, in the pattern of the circuits on the copper laminate. Electrolytic copper (acid copper) is then plated on top of the base copper laminate on the circuit areas, through the openings in the photoresist. After applying the electrolytic copper, a layer of tin or tin-lead, is pattern plated on the circuits to act as an etch resist. The remaining photoresist material is stripped from the substrate, exposing the base copper laminate. The base copper laminate is then removed, exposing the bare substrate (commonly glass enforced plastics). At this point in the HASL process, nothing remains on the substrate except the etch resist material plated on the copper circuit lines.

One disadvantage of this process is that extra-processing steps have to be applied. The etch resist material has to first be applied and then removed, and usually solder mask (SM) applied before HASL finishing can be accomplished. Furthermore, HASL coatings cannot be employed in the applications of mixed technologies due to their inability to meet substrate coplanarity and wire bonding requirements. The HASL finishing is a labor and maintenance intensive process and causes many environmental concerns because it usually contains lead.

The EN/IAu process requires essentially the same steps, up through the removal of tin or tin-lead and applying of SM, as the HASL process. Then, instead of applying flux and undergoing HASL, plating of electroless nickel and immersion gold is performed on the circuits. As with the HASL process, the EN/Au process has also many disadvantages. It suffers from high porosity, many processing steps, degradation when exposed to soldering temperatures and high expense.

There are many other competing technologies that are applied, but all require an etch resist to first be applied and then removed, demanding many processing steps. OSP and OSP/Ag are two of these post etch technologies applied directly to the surface of copper circuits. However, they have limited storage lives, degrade when exposed to soldering temperature and do not have good wire bondability.

None of the above-mentioned non-contact finishes can be used as a contact finish due to their poor wear resistence.

A contact finish, such as an electrolytic nickel layer with an electrolytic hard gold on top, must be applied on the contact areas after the non-contact finish is coated (as suggested previously). The contact finish has good conductivity and high wear resistance. However, it cannot be used as a non-contact finish due to its poor solderability and wire bondability. And to apply the contact finish to the board requires another masking step where SM is applied, the contact finish plated, then the SM stripped off. This increases processing steps and decreases production yields due to mis-registration of the SM.

The PWB industry has recently started to evaluate alternative surface finishes. There is a high demand for a multi-purpose finish that can be used for both non-contact circuits and contact areas and that can replace tin-lead in the PWB finishing process, to lower environmental concerns and make electronic circuit manufacturing "greener." To be qualified, such a finish should provide high etch resistance, good solderability, good wirebonding performance, high conductivity, high wear resistance, high corrosion resistance/low porosity, coplanarity (uniform thickness distribution), integrity after exposure to soldering temperatures for up to 10 minutes, ability to integrate into present manufacturing stream, long storage life (6 to 12 months), favorable economics and environmental safety. With such a finish, one can dramatically reduce the processing steps, increase the production throughput, reduce the cost and improve the quality of the PWBs. It was previously thought that palladium or palladium-nickel alloys might be used as a multi-purpose finish in PWBs. However, pure palladium suffers from relatively high porosity and relatively high cost, and palladium-nickel alloys exhibit lower wear resistance than what is needed for today's demanding technologies.

Accordingly, what is needed in the art is a multi-purpose finish that meets all the above-mentioned requirements and achieves all the above-mentioned objectives.

SUMMARY OF THE INVENTION

To address the above-discussed deficiencies of the prior art, the present invention provides a multi-purpose finish for a PWB and a method of manufacturing the same. In one embodiment, the PWB includes: (1) a substrate having a conductive trace located thereon and (2) a multi-purpose finish including palladium alloy where palladium is alloyed with cobalt or a platinum group metal and is located on at least a portion of the conductive trace, which forms both a non-contact finish and a contact finish for the PWB. Platinum group metal is a metal selected from the group consisting of Ruthenium, Rhodium, Palladium, Rhenium, Osmium, Iridium and Platinum.

The present invention therefore introduces the broad concept of employing a palladium alloy, where the palladium alloy is alloyed with cobalt or a platinum group metal, as a multi-purpose finish for PWBs, suitable for forming both non-contact and contact finishes. The palladium alloy when alloyed with cobalt includes about 1 wt.% or more of cobalt and may further include nickel or iron. The palladium alloy may further be alloyed with both cobalt and a platinum group metal. The palladium alloy acts also as an etch resist layer.

In one embodiment, the non-contact finish coats at least a portion of a non-contact area. In a related embodiment, the contact finish coats at least a portion of a contact area. In another embodiment the palladium alloy is located on all of the conductive traces. The conductive traces preferably comprise copper. However, other conductive materials such as copper alloys, aluminum, nickel, silver, gold, platinum or their alloys may be used for the conductive traces.

The palladium alloy employed in the present invention is such that palladium comprises a weight percent of the palladium alloy ranging from about 10 wt.% to about 95 wt.% and cobalt or a platinum group metal comprises a weight percent of the palladium alloy ranging from about 5 wt.% to about 90 wt.% of the palladium alloy.

The PWB may also preferably include a material formed over the multi-purpose finish, and in such instances, the material may be palladium, silver, gold, rhodium, ruthenium, platinum, tin or their alloys, or an organic solderability preservative (OSP).

In another embodiment, nickel may be applied, using conventional deposition processes, under the palladium alloy, forming a nickel under-layer. Those skilled in the art should understand that the nickel deposition step may be optional and omitted in some applications. However, where nickel is required it should also be understood that other materials such as nickel alloy, cobalt, cobalt alloy, iron or iron alloy may also be used.

In another embodiment of the present invention, the non-contact areas comprise surface-mount pads, wire bond pads, solder pads or interconnections. Interconnections as used by Applicants are defined as the circuit traces, plated through holes (PTH) and micro-vias. Those skilled in the pertinent art will realize, however, that the palladium alloy may be advantageously employed in other PWB finishes, such as for vias or decorative designs.

The substrate may comprise various materials that are typically used for PWB fabrication. Examples of these materials contain epoxies, polyimides, fluorinated polymers, ceramics, polyesters, phenolics, and aramide paper.

The foregoing has outlined, rather broadly, preferred and alternative features of the present invention so that those skilled in the art may better understand the detailed description of the invention that follows. Additional features of the invention are described hereinafter that form the subject of the claims of the invention. Those skilled in the art should appreciate that they can readily use the disclosed conception and specific embodiment as a basis for designing other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIGS. 1A through 1J illustrate exemplary, cross-sectional views of a printed wiring board (PWB), which are not drawn to scale, constructed according to the principles of the present invention; and FIG. 2 illustrates a method for using a palladium alloy as a final finish for a PWB.

DETAILED DESCRIPTION

Figure 1A:
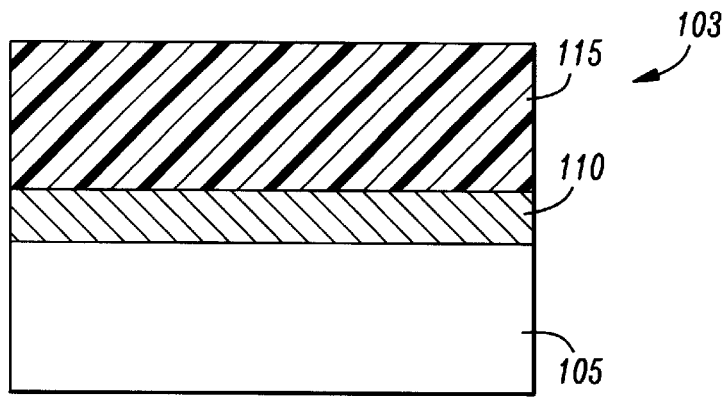
Figure 1B:
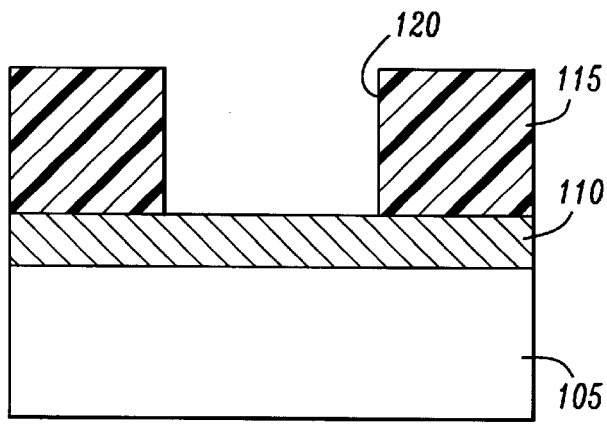

Turning initially to FIG. 1A there is illustrated a PWB 103 having a substrate 105, normally a material, such as glass enforced plastic, on which numerous layers may be formed. While the substrate 105 illustrated in this advantageous embodiment is composed of glass enforced plastic, those skilled in the art will realize that the substrate 105 may be composed of any substrate materials, including epoxies, polyimides, fluorinated polymers, ceramics, polyesters, phenolics, and aramide paper. A base copper laminate 110 or similar laminate material is placed over the entire substrate 105. Following the application of the base copper laminate 110, a photoresist layer 115 is then applied on top of the base copper laminate 110. The photoresist layer 115 is subjected to ultraviolet light which exposes the circuit trace pattern thereon and the circuit trace pattern is formed as seen in FIG. 1B.

Figure 1C:
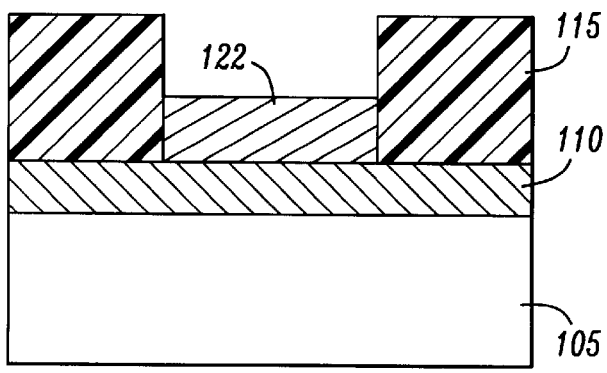
Figure 1D:
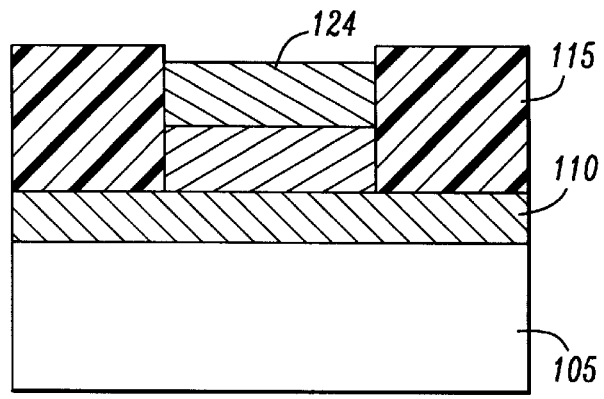

Using an acid copper plating method, an electrolytic copper plate 122 is formed in the opening 120 created by the photoresist, and on top of the base copper laminate 110. However, other types of copper, or similar material, may also be used. (see FIG. 1C). Next, as shown in FIG. 1D, a nickel layer 124 (nickel under-layer) is plated within the opening 120, and on top of the electrolytic copper plate 122, by conventional deposition processes. The nickel layer 124 is placed upon the electrolytic copper plate 122 to prevent oxidation of the copper and to give additional hardness to the surface finish. Nickel, like copper, is known to oxidize and produce nickel oxide, but contrary to copper oxide, nickel oxide does not creep along the surface. Nickel's tendency to produce nickel oxide is further reduced when the palladium alloy, is applied over nickel. While nickel is described in this embodiment, those skilled in the art should understand that the nickel deposition step may be optional and omitted in some applications. However, where nickel is required it should also be understood that materials similar to nickel such as nickel alloys, cobalt, cobalt alloys, iron and iron alloys may be used.

Figure 1E:
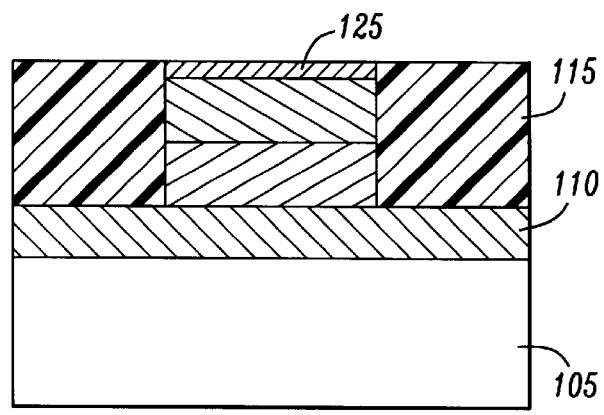

Referring next to FIG. 1E, a layer of a palladium alloy 125 is placed over the nickel layer 124, which is on top of the electrolytic copper plate 122. The palladium alloy 125 replaces the tin or tin-lead plating process present in conventional processes. The palladium is alloyed with cobalt or a platinum group metal as defined herein. In those embodiments where the palladium is alloyed with cobalt, the alloy may further include a tertiary metal, such as nickel or iron. In these particular embodiments, the cobalt comprises about 1 wt.% or more of the palladium-cobalt alloy. In another embodiment, the palladium alloy 125 illustrated may be comprised of 80 wt.% palladium and 20 wt.% cobalt or platinum group metal. However, those skilled in the art will realize, of course, that similar ratios of palladium to cobalt or a platinum group metal may also be used. For example, it has been found that the palladium alloy 125 may be comprised of palladium ranging from about 50 to about 95 wt.% of the alloy and cobalt or a platinum group metal ranging from about 5 to about 50 wt.% percent of the alloy. Other details of how the palladium alloy 125 may be formed are described in detail in U.S. patent application, Ser. No. 08/974,120, filed Nov. 19, 1997, for "COMPOSITION FOR ELECTROPLATING PALLADIUM ALLOYS AND ELECTROPLATING PROCESS USING THAT COMPOSITION," which is incorporated herein by reference. Other details regarding electroplating palladium alloys are described in U.S. patent application, Ser. No. 08/644, 347, filed May 10, 1996, which is also incorporated herein by reference.

One major advantage that the palladium alloy 125 provides in PWB manufacturing is its use as an etch resist replacement for tin or tin-lead. When used in this manner, the palladium alloy 125 may now be used as a multi-purpose finish for both non-contact and contact finishes. The use of a palladium alloy 125 not only removes lead from the surface finishing production area, a major waste treatment expense, but the cycle time becomes much shorter as the plating and subsequent stripping of the etch resist material is eliminated. Fabrication time is substantially shortened because about 50% of the processing steps can be eliminated.

The palladium alloys 125, as defined herein, have a characteristic of low porosity. Low porosity minimizes formation of corrosion products of exposed copper and/or nickel on the surface of the palladium alloy, which in turn, preserves conductivity, solderability and wire bondability of the surface.

Likewise, the palladium alloy 125 provides superior wear resistance, excellent diffusion/migration barrier properties, high thermal stability and good coplanarity. All these properties make the palladium alloy 125 a good finish for both non-contact and contact areas.

Figure 1F:
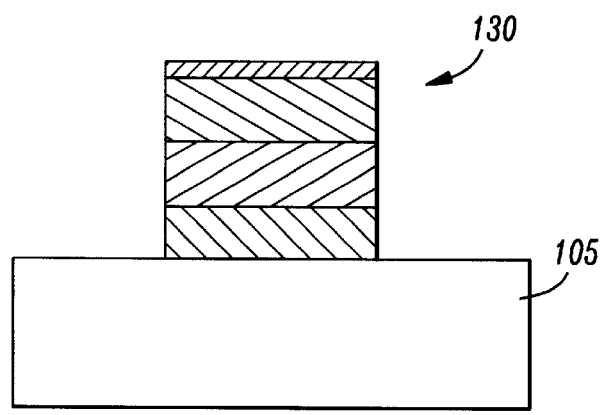

After the palladium alloy 125 deposition, the photoresist layer 115 is stripped. This uncovers portions of the base copper laminate 110 that are to be removed. The exposed base copper laminate 110, which was formerly covered by the photoresist (see FIG. 1E), is etched away using conventional copper etch processes, which results in the circuit traces 130 as illustrated in FIG. 1F. The palladium alloy 125 acts as an etch resist to a portion of the copper circuit traces 130. What is left after the resist strip and copper etch is a substrate 105, covered by a copper circuitry 130.

Figure 1G:
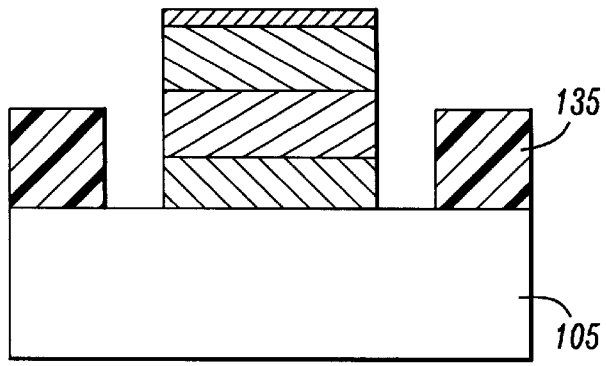

The final, required, step of the process is shown in FIG. 1G, and comprises the function of applying a solder mask 135 to the substrate 105. A solder mask 135 is applied to prevent solder bridges from forming during the assembly performed by the board user.

One concern is that after using the palladium alloy 125 as an etch resist, there may be exposed copper circuitry 130 on the circuit side walls. The exposed copper circuitry 130 may be covered with a protective coating, in an additional step. The protective coating may be a variety of coatings, such as palladium, silver, gold, rhodium, ruthenium, platinum, tin or their alloys, or organic solderability preservative (OSP). These coatings may be applied by conventional processes.

Figure 1H:
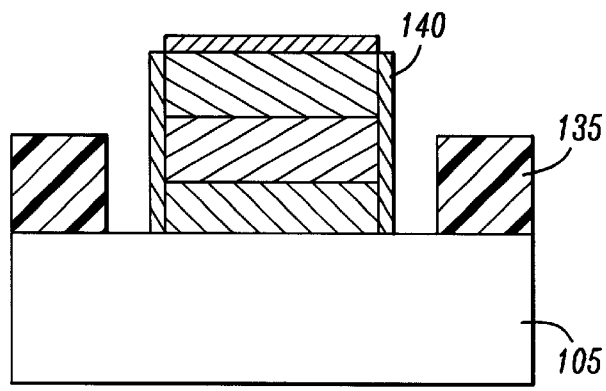
Figure 1I:
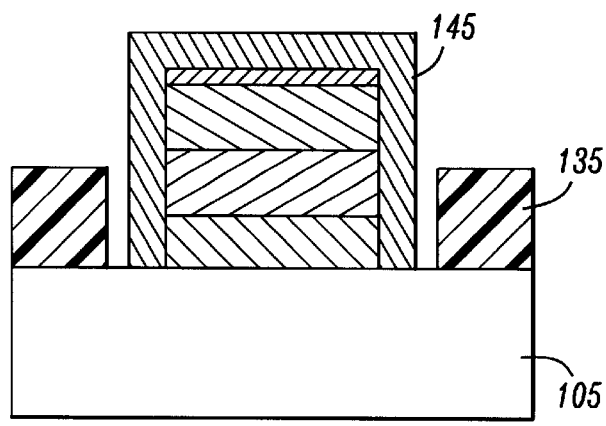

FIGS. 1H through 1J illustrate three of the many processes that may be applied to prevent copper creep. In one optional step, the copper circuitry 130 can be subjected to an immersion palladium plate 140 after the solder mask 135 is applied to the substrate 105. (See FIG. 1H). The immersion palladium plate 140 is applied in a manner similar to electroless plating except that the reduction of metal ions in the plating solution is accomplished by the oxidation of the metal on the part being plated, rather than by a reducing agent in the solution.

As shown in FIG. 1I, which is an alternative to an immersion palladium plate 140, an electroless palladium plate 145 can be applied. The electroless palladium plate 145 is formed using a reduction process and covers the remaining copper circuitry 130. Using an electroless palladium plate provides more even thickness distribution, than when using an electrolytic palladium plate and greater thickness than received when using an immersion palladium plate 140.

Another process, as shown in FIG. 1J, consists of subjecting the PWB apparatus in FIG. 1G to an immersion gold plate 150. By using an immersion gold plate 150 over the copper circuitry 130, an increase in solderability, wire bondability and wear resistance is achieved. Gold increases the wetting speed of the product when subjected to the molten solder, which in turn increases the solderability of the surface. Additionally, since most wires that are attached to the surface of a PWB comprise gold and the surface comprises gold, the commonality of the two materials makes for a stronger wire bond. Also, the properties of gold help it to function as a form of lubrication, which in turn increases the wear resistance of the surface.

FIG. 2 is a flow chart showing the various steps that might occur in the embodiments just discussed above. As shown, one embodiment may further include a clean copper laminate/substrate step 205 followed by a micro-etch copper laminate/substrate step 210 and an acid dip copper laminate/substrate step 215. Following the copper plating 220, the copper and the substrate may also be acid dipped in step 225. To assure a clean surface on which to form the solder mask, the substrate may undergo a pre-clean step 245. The other steps appearing in FIG. 2 have been discussed with respect to the previously described embodiments. Those steps include an optional nickel plate 228, a palladium alloy plate 230, a resist step 235, a copper etchant step 240 and a solder mask step 250.

As a result of the discussions above, the use of a palladium alloy as a multi-purpose PWB finish on both non-contact circuits and contact areas reduces more than 50% of the process steps, maintains or even improves the required material properties, and achieves considerable cost saving. Cost saving is achieved through process step reduction, cheaper deposit material, and improved finish performance.

Although the present invention has been described in detail, those skilled in the art should understand that they can make various changes, substitutions and alterations herein without departing from the spirit and scope of the invention in its broadest form.

What is claimed is:

1. A printed wiring board (PWB), comprising: a substrate having at least one conductive trace thereon, said conductive trace consisting of:
   a copper or copper alloy laminate layer located on said substrate, defining a pattern of said trace on said substrate;
   an intermediate copper layer located on said laminate layer;
   a nickel under-layer located on said intermediate layer; and
   a multi-purpose finish consisting of a palladium alloy, wherein palladium is alloyed with cobalt or a platinum group metal, said palladium alloy located on at least portions of said under-layer, that forms both a non-contact finish and a contact finish for said PWB; and a gold outer coating covering at least portions of said conductive trace.

2. The PWB as recited in claim 1 wherein said palladium alloy is palladium-cobalt alloy and said palladium-cobalt alloy further includes nickel or iron.

3. The PWB as recited in claim 2 wherein said cobalt comprises about 1 wt.% or more of said palladium-cobalt alloy.

4. The PWB as recited in claim 1 wherein said palladium alloy is an etch resist layer.

5. The PWB as recited in claim 1 wherein said conductive trace is located on at least a portion of a non-contact area.

6. The PWB as recited in claim 5 wherein said non-contact area is selected from the group consisting of:
   a surface-mount pad,
   a wire bond pad,
   a solder pad, and
   an interconnection.

7. The PWB as recited in claim 1 wherein said conductive trace is located on at least a portion of a contact area.

8. The PWB as recited in claim 1 wherein palladium comprises a weight percent of said palladium alloy ranging from about 10 wt.% to about 95 wt.% and cobalt or a platinum group metal comprises a weight percent of said palladium alloy ranging from about 5 wt.% to about 90 wt.% of said palladium alloy.

9. The PWB as recited in claim 1 wherein palladium comprises a weight percent of said palladium alloy ranging from about 50 wt.% to about 95 wt.% and cobalt or a platinum group metal comprises a weight percent of said palladium alloy ranging from about 5 wt.% to about 50 wt.% of said palladium alloy.

10. The PWB as recited in claim 1 wherein said palladium alloy is located on all of said conductive traces.

11. The PWB as recited in claim 1 wherein said substrate is comprised of a material selected from the group consisting of:
   epoxies;
   polyimides;
   fluorinated polymers;
   ceramics;
   polyesters;
   phenolics; and
   aramide paper.

* * * * *